United States Patent
Lee et al.

(10) Patent No.: US 9,755,511 B2
(45) Date of Patent: Sep. 5, 2017

(54) CURRENT REGULATOR CIRCUIT CAPABLE OF REDUCING CURRENT RIPPLE AND METHOD OF REDUCING CURRENT RIPPLE

(71) Applicant: RICHTEK TECHNOLOGY CORPORATION, Zhubei, HsinChu (TW)

(72) Inventors: Yi-Wei Lee, Taipei (TW); Isaac Y. Chen, Zhubei (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/076,908

(22) Filed: Mar. 22, 2016

(65) Prior Publication Data

US 2016/0285366 A1 Sep. 29, 2016

Related U.S. Application Data

(60) Provisional application No. 62/137,363, filed on Mar. 24, 2015.

(51) Int. Cl.

| H02M 1/08 | (2006.01) |
| H02M 3/157 | (2006.01) |
| H02M 3/156 | (2006.01) |
| H02M 1/14 | (2006.01) |
| H05B 33/08 | (2006.01) |
| H03K 17/16 | (2006.01) |
| H02M 1/00 | (2006.01) |

(52) U.S. Cl.
CPC ............ *H02M 3/156* (2013.01); *H02M 1/08* (2013.01); *H02M 1/14* (2013.01); *H03K 17/166* (2013.01); *H05B 33/0815* (2013.01); *H05B 33/0824* (2013.01); *H02M 2001/0009* (2013.01); *H02M 2001/0048* (2013.01); *H03K 2217/0027* (2013.01); *Y02B 20/347* (2013.01); *Y02B 70/1491* (2013.01)

(58) Field of Classification Search
CPC ......... H02M 1/08; H02M 3/156; H02M 3/157
USPC .......................................... 323/266, 282, 283
See application file for complete search history.

(56) References Cited

U.S. PATENT DOCUMENTS

| 8,878,505 | B2* | 11/2014 | Temkin | H02M 3/33523 323/282 |
| 9,107,260 | B2 | 8/2015 | Sun et al. | |
| 2014/0320099 | A1* | 10/2014 | Chen | H02M 1/4225 323/282 |
| 2016/0036324 | A1* | 2/2016 | Hofmann | H02M 3/156 315/210 |

(Continued)

*Primary Examiner* — Jeffrey Sterrett
(74) *Attorney, Agent, or Firm* — Tung & Associates

(57) ABSTRACT

The present invention discloses a current regulator circuit capable of reducing current ripple and a method of reducing current ripple. A power supply circuit generates a load current which originally has a current ripple. The load current is supplied to a load circuit. The current regulator circuit includes a regulator switch coupled to the load circuit, a current sense circuit for sensing the load current, and a control circuit. The control circuit controls the regulator switch to regulate a peak of a current sense signal minus an average of the current sense signal to a non-negative first predetermined value, or regulate the peak minus a valley of the current sense signal to a non-negative second predetermined value.

24 Claims, 6 Drawing Sheets

(56) References Cited

U.S. PATENT DOCUMENTS

2016/0285366 A1* 9/2016 Lee .................... H05B 33/0815

* cited by examiner

CURRENT REGULATOR CIRCUIT CAPABLE OF REDUCING CURRENT RIPPLE AND METHOD OF REDUCING CURRENT RIPPLE

CROSS REFERENCE

The present invention claims priority to U.S. 62/137,363, filed on Mar. 24, 2015.

BACKGROUND OF THE INVENTION

Field of Invention

The present invention relates to a current regulator circuit capable of reducing current ripple and a method of reducing current ripple; particularly, it relates to such current regulator circuit capable of reducing current ripple and method of reducing current ripple which reduce the current ripple of a load current according to a peak-to-average difference or a peak-to-valley difference of the current ripple.

Description of Related Art

FIG. 1 shows a schematic diagram of a light emitting diode (LED) power supply circuit 10, which operates to generate an output voltage Vout and an output current Iout, and provide a light emitting device current ILED to an LED circuit 20, wherein the signal waveform of the output voltage Vout is indicated by the waveform shown in the figure. As shown in FIG. 1, a power conversion circuit 30 receives an AC voltage which is generated by an AC power source 40, and the power conversion circuit 30 rectifies the AC voltage and converts the rectified voltage to the output voltage Vout and generate the output current Iout. An output capacitor Cout is connected to the power conversion circuit 30 to filter the output voltage Vout. A light emitting device current ILED, which is generated according to the output current Iout, is provided to the LED circuit 20.

In general, for better power factor correction (PFC), the power conversion circuit 30 typically includes a PFC circuit (not shown, as well known by those skilled in the art, so details thereof are omitted here), which causes the output current Iout (and therefore the light emitting device current ILED) to carry a current ripple with a frequency which is twice the frequency of the AC voltage. For example, if the AC voltage has a frequency of 50 Hz or 60 Hz, the current ripple of the output current Iout will have a frequency of 100 Hz or 120 Hz. 100 Hz to 120 Hz is in a low frequency range, and a capacitor typically used for the output capacitor Cout does not have a capacitance which is capable of filtering out the current ripple with such a low frequency. Therefore, the light emitting device current ILED flowing through the LED circuit 20 will also have a current ripple with the same frequency, which causes the LED circuit 20 to flicker slightly. Human eyes may not perceive the flicker, but such flicker can degrade the images taken by an image taking device such as a camera or a video recorder.

To deal with the above problem, U.S. Pat. No. 9,107,260 B2 discloses an LED driver circuit for canceling the current ripple, and CN patent application 201410040888 discloses a current regulator control circuit and a control method thereof. The above prior art patent and patent application require obtaining information of an absolute level of a load current and using the absolute level as a basis for further processing (e.g., to be compared with a reference voltage). However, the absolute level of the load current will change depending on different LED circuits because different LEDs have different voltage drops. As such, it is difficult to determine a proper reference voltage to be compared with the absolute level of the load current. Besides, because the above prior art patent and patent application obtain the required information by sensing the source voltage of a power switch, and the source voltage carries a ripple with a low frequency, so the prior art requires a capacitor with a relatively higher capacitance, which leads to a higher manufacturing cost. Furthermore, because the prior art requires sensing the absolute level of the load current and processing the sensed signals, and the accumulated voltage drops of multiple LEDs can be huge, the devices used in the prior art need to withstand relatively higher voltages, which also leads to a higher manufacturing cost.

In view of above, the present invention proposes a current regulator circuit, which reduces the current ripple of a load current according to a peak-to-average difference or a peak-to-valley difference of the current ripple, and a corresponding method of reducing current ripple.

SUMMARY OF THE INVENTION

From one perspective, the present invention provides a current regulator circuit, which is configured to operably regulate a load current flowing through a load circuit coupled to the current regulator circuit, wherein the load circuit is coupled to a power supply circuit which provides an output voltage and a load current to the load circuit, wherein the current regulator circuit is configured to operably reduce a current ripple in the load current, the current regulator circuit comprising: a regulator switch, which is configured to be operably coupled to the load circuit, and operate according to a control signal, to regulate the load current; a current sense circuit, which is coupled to the regulator switch, and configured to operably sense the load current to generate a current sense signal; and a control circuit, which is coupled to the regulator switch and the current sense circuit, and configured to operably generate a control signal for controlling the regulator switch according to the current sense signal, wherein the control circuit regulates a peak-to-average difference to a non-negative and fixed first predetermined value, wherein the peak-to-average difference is obtained according to a peak of the current sense signal minus an average of the current sense signal, or regulates a peak-to-valley difference to a non-negative and fixed second predetermined value, wherein the peak-to-valley difference is obtained according to the peak of the current sense signal minus a valley of the current sense signal.

In one preferable embodiment, the regulator switch is controlled to operate around a boundary of a triode region and a saturation region.

In one preferable embodiment, the current regulator circuit further comprises an auto-gain control circuit, which is coupled between the current sense circuit and the control circuit, and configured to operably adjust the current sense signal within a predetermined range.

In one preferable embodiment, the control circuit includes: a peak sense-and-hold circuit, which is coupled to the current sense circuit, and configured to operably sense and hold the peak of the current sense signal, so as to generate a peak sense-and-hold signal according to the current sense signal; a low-pass filter circuit, which is coupled to the current sense circuit, and configured to operably obtain the average of the current sense signal, so as to generate an average signal; an offset circuit, which is coupled to the low-pass filter circuit, and configured to operably offset the average with the first predetermined value, so as to generate an average offset signal; and an amplifier circuit, which is coupled to the peak sense-andhold circuit and the offset circuit, and configured to operably compare the peak sense-and-hold signal with the average offset signal, to generate the control signal, for regulating the peak-to-average difference to the first predetermined value.

In one preferable embodiment, the control circuit includes: a peak sense-and-hold circuit, which is coupled to the current sense circuit, and configured to operably sense and hold the peak of the current sense signal, so as to generate a peak sense-and-hold signal; a valley sense-and-hold circuit, which is coupled to the current sense circuit, and configured to operably sense and hold the valley of the current sense signal, so as to generate a valley sense-and-hold signal; an offset circuit, which is coupled to the valley sense-and-hold circuit, and configured to operably offset the valley sense-and-hold signal with the second predetermined value, so as to generate a valley offset signal; and an amplifier circuit, which is coupled to the peak sense-and-hold circuit and the offset circuit, and configured to operably compare the peak sense-and-hold signal with the valley offset signal, to generate the control signal, for regulating the peak-to-valley difference to the second predetermined value.

In one preferable embodiment, the control circuit includes: a peak and valley sense circuit, which is coupled to the current sense circuit, and configured to operably sense the peak-to-valley difference according to the current sense signal, so as to generate a peak-to-valley difference sense signal; a predetermined value setting circuit, which is configured to operably generate an offset signal according to the second predetermined value; and an amplifier circuit, which is coupled to the peak and valley sense circuit and the predetermined value setting circuit, and configured to operably generate the control signal according to the peak-to-valley difference sense signal and the offset signal, for regulating the peak-to-valley difference to the second predetermined value.

In one preferable embodiment, the control circuit includes: a peak sense circuit, which is coupled to the current sense circuit, and configured to operably sense the peak of the current sense signal, so as to generate a peak sense signal; a low-pass filter circuit, which is coupled to the current sense circuit, and configured to operably obtain the average of the current sense signal, so as to generate an average signal; an analog-to-digital conversion circuit, which is coupled to the peak sense circuit and the low-pass filter circuit, and configured to operably convert the peak sense signal and the average signal to a digital peak sense signal and a digital average signal respectively; a subtraction circuit, which is coupled to the analog-to-digital conversion circuit, and configured to operably generate a digital peak-to-average difference signal according to the digital peak sense signal and the digital average signal; an offset circuit, which is coupled to the subtraction circuit, and configured to operably offset the digital peak-to-average difference signal with the first predetermined value, so as to generate a digital peak-to-average difference offset signal; and a buffer circuit, which is coupled to the offset circuit, and configured to operably generate the control signal according to the digital peak-to-average difference offset signal, for regulating the peak-to-average difference to the first predetermined value.

In the aforementioned embodiment, the buffer circuit preferably includes: an oscillator circuit, which is coupled to the offset circuit, and configured to operably generate a digital control signal according to the digital peak-to-average difference offset signal and an oscillator frequency signal; and a buffer, which is coupled to the oscillator circuit, and configured to operably receive the digital control signal and generate the control signal.

In one preferable embodiment, the control circuit includes: a peak sense circuit, which is coupled to the current sense circuit, and configured to operably sense the peak of the current sense signal, so as to generate a peak sense signal; a valley sense circuit, which is coupled to the current sense circuit, and configured to operably sense the valley of the current sense signal, so as to generate a valley sense signal; an analog-to-digital conversion circuit, which is coupled to the peak sense circuit and the valley sense circuit, and configured to operably convert the peak sense signal and the valley sense signal to a digital peak sense signal and a digital valley sense signal respectively; a subtraction circuit, which is coupled to the analog-to-digital conversion circuit, and configured to operably generate a digital peak-to-valley difference signal according to the digital peak sense signal and the digital valley sense signal; an offset circuit, which is coupled to the subtraction circuit, and configured to operably offset the digital peak-to-valley difference signal with the second predetermined value, so as to generate a digital peak-to-valley difference offset signal; and a buffer circuit, which is coupled to the offset circuit, and configured to operably generate the control signal according to the digital peak-to-valley difference offset signal, for regulating the peak-to-valley difference to the second predetermined value.

In the aforementioned embodiment, the buffer circuit preferably includes: an oscillator circuit, which is coupled to the offset circuit, and configured to operably generate a digital control signal according to the digital peak-to-average difference offset signal and an oscillator frequency signal; and a buffer, which is coupled to the oscillator circuit, and configured to operably receive the digital control signal and generate the control signal.

In one preferable embodiment, the control circuit includes: a peak and valley sense circuit, which is coupled to the current sense circuit, and configured to operably sense the peak-to-valley difference according to the current sense signal, so as to generate a peak-to-valley difference sense signal; a predetermined value setting circuit, which is configured to operably generate an offset signal according to the second predetermined value; an analog-to-digital conversion circuit, which is coupled to the peak and valley sense circuit and the predetermined value setting circuit, and configured to operably convert the peak-to-valley difference sense signal and the offset signal to a digital peak-to-valley difference sense signal and a digital offset signal respectively; a subtraction circuit, which is coupled to the analog-to-digital conversion circuit, and configured to operably generate a digital peak-to-valley difference signal according to the digital peak-to-valley difference sense signal and the digital offset signal; and a buffer circuit, which is coupled to the subtraction circuit, and configured to operably generate the control signal according to the digital peak-to-valley difference offset signal, for regulating the peak-to-valley difference to the second predetermined value.

In the aforementioned embodiment, the buffer circuit preferably includes: an oscillator circuit, which is coupled to the subtraction circuit, and configured to operably generate a digital control signal according to the digital peak-to-valley difference offset signal and an oscillator frequency signal; and a buffer, which is coupled to the oscillator circuit, and configured to operably receive the digital control signal and generate the control signal.

From another perspective, the present invention provides a method of reducing current ripple, wherein a power supply circuit provides an output voltage and a load current to a load circuit, and the method of reducing current ripple is for reducing a current ripple in the load current, the method comprising: sensing the load current flowing through the load circuit to generate a current sense signal; generating a control signal according to the current sense signal; operating a regulator switch according to the control signal, to regulate the load current; and feedback controlling a peak-to-average difference to a non-negative and fixed first predetermined value, wherein the peak-to-average difference is obtained according to a peak of the current sense signal minus an average of the current sense signal, or feedback controlling a peak-to-valley difference to a non-negative and fixed second predetermined value, wherein the peak-to-valley difference is obtained according to the peak of the current sense signal minus a valley of the current sense signal.

In one preferable embodiment, the regulator switch is controlled to operate around a boundary of a triode region and a saturation region.

In one preferable embodiment, the method of reducing current ripple further comprises: adjusting the current sense signal within a predetermined range.

In one preferable embodiment, the step of generating a control signal according to the current sense signal includes: sensing and holding the peak of the current sense signal, to generate a peak sense-and-hold signal; obtaining the average of the current sense signal, to generate an average signal; offsetting the average signal with the first predetermined value, to generate an average offset signal; and comparing the peak sense-and-hold signal with the average offset signal, to generate the control signal, for controlling the peak-to-average difference to the first predetermined value.

In one preferable embodiment, the step of generating a control signal according to the current sense signal includes: sensing and holding the peak of the current sense signal, to generate a peak sense-and-hold signal; sensing and holding the valley of the current sense signal, to generate a valley sense-and-hold signal; offsetting the valley sense-and-hold signal with the second predetermined value, to generate a valley offset signal; and comparing the peak sense-and-hold signal with the valley offset signal, to generate the control signal, for controlling the peak-to-valley difference to the second predetermined value.

In one preferable embodiment, the step of generating a control signal according to the current sense signal includes: sensing the peak-to-valley difference of the current sense signal, to generate a peak-to-valley difference sense signal; generating an offset signal according to the second predetermined value; and generating the control signal according to the peak-to-valley difference sense signal and the offset signal, for controlling the peak-to-valley difference to the second predetermined value.

In one preferable embodiment, the step of generating a control signal according to the current sense signal includes: sensing the peak of the current sense signal, to generate a peak sense signal; obtaining the average of the current sense signal, to generate an average signal; converting the peak sense signal and the average signal to a digital peak sense signal and a digital average signal respectively; generating a digital peak-to-average difference signal according to the digital peak sense signal and the digital average signal; offsetting the digital peak-to-average difference signal with the first predetermined value, to generate a digital peak-to-average difference offset signal; and generating the control signal according to the digital peak-to-average difference offset signal, for controlling the peak-to-average difference to the first predetermined value.

In the aforementioned embodiment, the step of generating the control signal according to the digital peak-to-average difference offset signal preferably includes: generating a digital control signal according to the digital peak-to-average difference offset signal and an oscillator frequency signal; and converting the digital control signal to the control signal.

In one preferable embodiment, the step of generating a control signal according to the current sense signal includes: sensing the peak of the current sense signal, to generate a peak sense signal; sensing the valley of the current sense signal, to generate a valley sense signal; converting the peak sense signal and the valley sense signal to a digital peak sense signal and a digital valley sense signal respectively; generating a digital peak-to-valley difference signal according to the digital peak sense signal and the digital valley sense signal; offsetting the digital peak-to-valley difference signal with the second predetermined value, to generate a digital peak-to-valley difference offset signal; and generating the control signal according to the digital peak-to-valley difference offset signal, for controlling the peak-to-valley difference to the second predetermined value.

In the aforementioned embodiment, the step of generating the control signal according to the digital peak-valley difference offset signal preferably includes: generating a digital control circuit according to the digital peak-to-valley difference offset signal and an oscillator frequency signal; and converting the digital control signal to the control signal.

In one preferable embodiment, the step of generating a control signal according to the current sense signal includes: sensing the peak-to-valley difference of the current sense signal, to generate a peak-to-valley difference sense signal; generating an offset signal according to the second predetermined value; converting the peak-to-valley difference sense signal and the offset signal to a digital peak-to-valley difference sense signal and a digital offset signal respectively; generating a digital peak-to-valley difference signal according to the digital peak-to-valley difference sense signal and the digital offset signal; and generating the control signal according to the digital peak-to-valley difference offset signal, for controlling the peak-to-valley difference to the second predetermined value.

In the aforementioned embodiment, the step of generating the control signal according to the digital peak-valley difference offset signal preferably includes: generating a digital control circuit according to the digital peak-to-valley difference offset signal and an oscillator frequency signal; and converting the digital control signal to the control signal.

The objectives, technical details, features, and effects of the present invention will be better understood with regard to the detailed description of the embodiments below.

DESCRIPTION OF THE PREFERRED EMBODIMENTS

Figure 1:
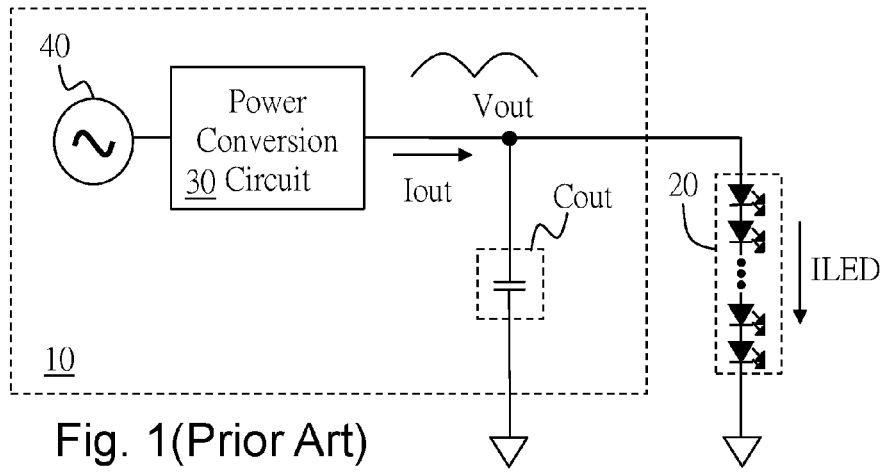
FIG. 1 shows a schematic diagram of a prior art light emitting diode (LED) power supply circuit.
Figure 2A:
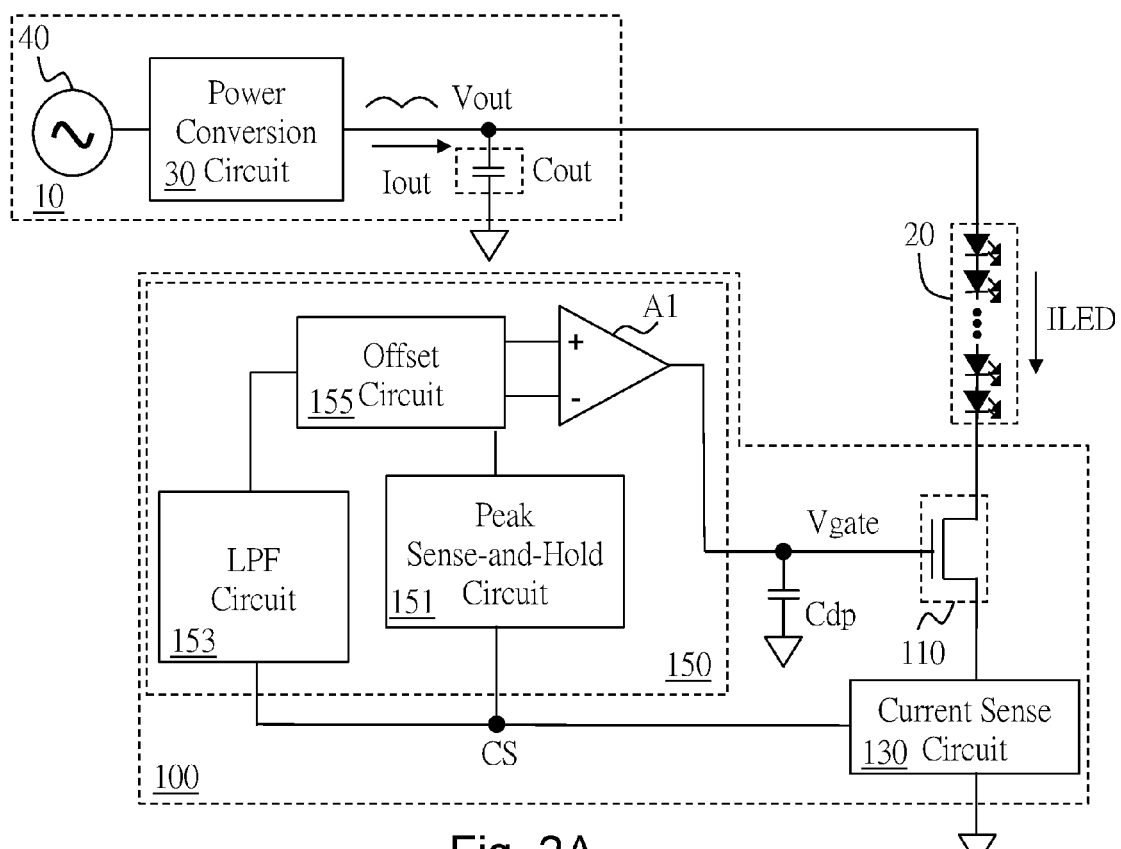
FIGS. 2A and 2B show a first embodiment of the present invention.
Figure 2B:
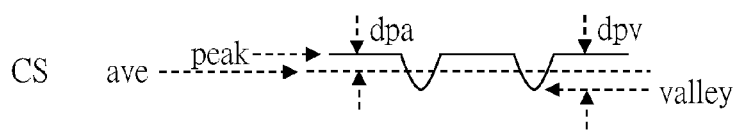

Please refer to FIGS. 2A and 2B for a first embodiment according to the present invention. As shown in FIG. 2A, a light emitting device circuit for example is the light emitting diode (LED) circuit 20 as shown in the figure, and includes one single LED string. Note that the light emitting device circuit is not limited to the LED circuit 20 as shown, which has only one single LED string, but the light emitting device circuit may include an LED array consisting of plural LED strings connected in parallel, or one or more light emitting devices of any kind connected in any form. The LED circuit 20 is coupled to a power supply circuit 10. The power supply circuit 10 generates an output voltage Vout and an output current Iout, and provides a light emitting device current (LED current ILED in this embodiment) to the LED circuit 20. The power supply circuit 10 for example includes a power conversion circuit 30, an AC power source 40, and an output capacitor Cout. The power conversion circuit 30 receives the AC voltage which is generated by the AC power source 40; the power conversion circuit 30 rectifies the AC voltage and converts the rectified voltage to the output voltage Vout, which is indicated by a small waveform shown in the figure, and the power conversion circuit 30 also generates the output current Iout, in order to supply the LED current ILED to the LED circuit 20. The output capacitor Cout is connected to the power conversion circuit 30.

A current regulator circuit 100, which is capable of reducing current ripple, is coupled to a load circuit (i.e., the LED circuit 20 in this embodiment), for regulating a load current (i.e., the LED current ILED in this embodiment) flowing through the LED circuit 20, and reducing the current ripple in the load current. For PFC or other reasons, the output current Iout carries a current ripple, and if the LED circuit 20 is not coupled to the current regulator circuit 100, substantially the same current ripple will appear in the LED current ILED. The current regulator circuit 100 includes: a regulator switch 110, a current sense circuit 130, and a control circuit 150. The regulator switch 110 is coupled to the LED circuit 20, and operates according to a control signal Vgate, to regulate the LED current ILED. The current sense circuit 130 is coupled to the regulator switch 110, for sensing the LED current ILED to generate a current sense signal CS. The control circuit 150, which is coupled to the regulator switch 110 and the current sense circuit 130, generates the control signal Vgate for controlling the regulator switch 110 according to the current sense signal CS. By feedback control, the control circuit 150 is operable to regulate a peak-to-average difference dpa to a non-negative and fixed first predetermined value, wherein the peak-to-average difference dpa is obtained according to a peak (peak) of the current sense signal minus an average avg of the current sense signal CS, or to regulate a peak-to-valley difference dpv to a non-negative and fixed second predetermined value, wherein the peak-to-valley difference dpv is obtained according to the peak peak minus a valley (valley) of the current sense signal CS. The details will be explained later.

The regulator switch 110 is for example but not limited to a metal oxide semiconductor (MOS) device as shown in the figure. Certainly the regulator switch 110 may be another kind of device, such as a bipolar junction transistor (BJT). The current sense circuit 130 is for example but not limited to a resistor which is connected in series between the regulator switch 110 and a ground level, wherein a voltage drop generated by the LED current ILED flowing through the resistor is used as the current sense signal CS.

FIG. 2B shows a schematic diagram of a signal waveform of the current sense signal CS in a steady state. The current sense signal CS has a current ripple (not shown) which is substantially the same as the current ripple of the output current Iout before the current regulator circuit 100 starts operating. The signal waveform of the current sense signal CS indicated in FIG. 2B is the steady state after the current regulator circuit 100 starts operating. In the steady state, the peak peak of the current sense signal CS minus the average avg of the current sense signal CS, i.e., the peak-to-average difference dpa is regulated (feedback controlled) at the non-negative first predetermined value; or, the peak peak of the current sense signal CS minus the valley valley of the current sense signal CS, i.e., the peak-to-valley difference dpv is regulated (feedback controlled) at the non-negative second predetermined value. In the embodiment shown in FIG. 2A, a capacitor Cdp is provided in the control loop of the current regulator circuit 100, to mitigate an oscillation attitude of the control signal Vgate so as to speed up the convergence of the control signal Vgate. The capacitor Cdp is optional and can be omitted.

In this embodiment, the control circuit 100 includes: a peak sense-and-hold circuit 151, a low-pass filter circuit 153, an offset circuit 155, and an amplifier circuit A1. The peak sense-and-hold circuit 151 is coupled to the current sense circuit 130, for sensing and holding the peak peak, and generating a peak sense-and-hold signal according to the current sense signal CS. The low-pass filter circuit 153 is coupled to the current sense circuit 130, for obtaining the average avg of the current sense signal CS, and generating an average signal. The offset circuit 155 is coupled to the low-pass filter circuit 153, for offsetting the average avg with the first predetermined value, and generating an average offset signal. The amplifier circuit A1 is coupled to the peak sense-and-hold circuit 151 and the offset circuit 155, for comparing the peak sense-and-hold signal with the average offset signal, to generate the control signal Vgate, for regulating the peak-to-average difference dpa to the non-negative and fixed first predetermined value.

The present invention and the prior art is different in that, in the present invention, the peak peak of the current sense signal CS minus the average avg of the current sense signal CS, i.e., the peak-to-average difference dpa, is controlled at the non-negative and fixed first predetermined value; or, the peak peak of the current sense signal CS minus the valley valley of the current sense signal CS, i.e., the peak-to-valley difference dpv, is controlled at the non-negative and fixed second predetermined value, and the control signal Vgate is generated accordingly. The present invention does not need to measure and compare an absolute level of the load current (i.e., the absolute level of the LED current ILED in this embodiment) with a predetermined reference; the measurement and processing basis of the present invention is the relationship between the peak peak, the average avg, and the valley valley of the current sense signal CS, which is relative, not absolute, so it removes the concern of the variations of the absolute level of the LED current ILED because of the variations of different LED circuits. Besides, the peak peak, the average avg, and the valley valley of the current sense signal Cs are not impacted by the frequency of the current ripple, i.e., the ripple frequency does not impact the circuit operation of the present invention, so the present invention does not need a capacitor with a relatively higher capacitance, and the manufacturing cost is reduced. Furthermore, the present invention does not require devices withstanding relatively higher voltages, because the peak-to-average difference dpa and the peak-to-valley difference dpv are at a relatively lower voltage level, and the calculations based on these signals can be more stable and accurate.

Figure 3:
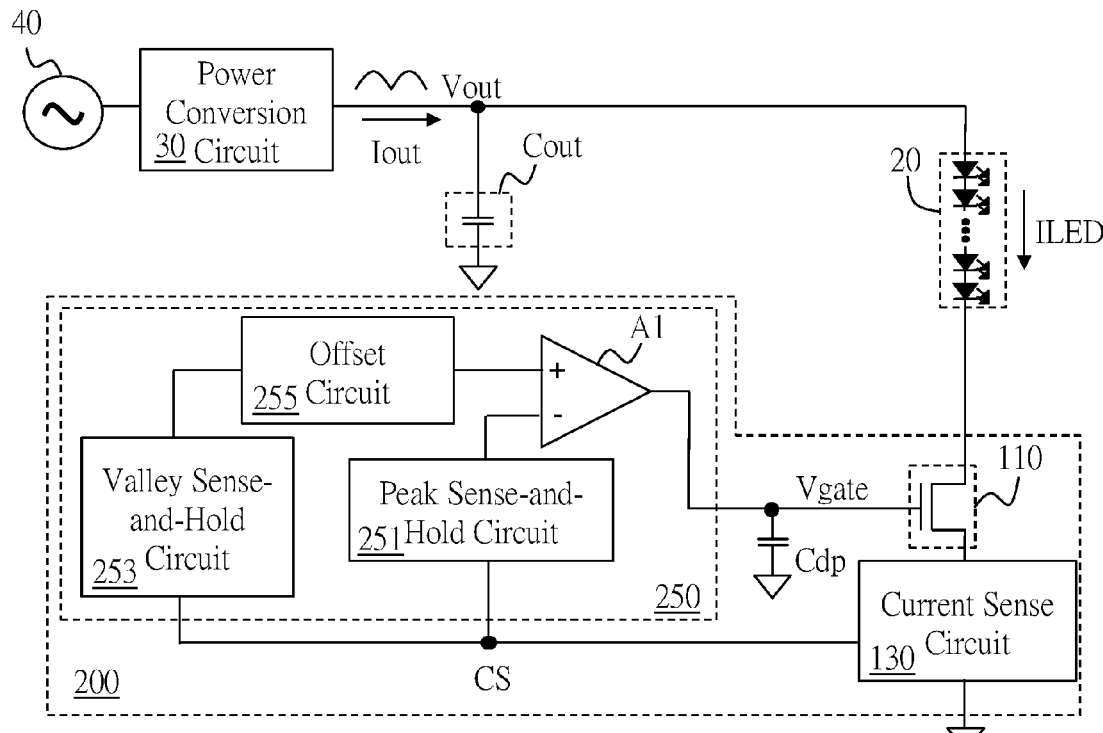
FIG. 3 shows a second embodiment of the present invention.

FIG. 3 shows a second embodiment of the present invention. In this embodiment, the current regulator circuit 200 capable of reducing current ripple includes: the regulator switch 110, the current sense circuit 130, and a control circuit 250. This embodiment is different from the first embodiment in that, in this embodiment, the control circuit 250 includes: a peak sense-and-hold circuit 251, a valley sense-and-hold circuit 253, an offset circuit 255, and an amplifier circuit A1. The peak sense-and-hold circuit 251 is coupled to the current sense circuit 130, for sensing and holding the peak peak according to the current sense signal CS, and generating the peak sense-and-hold signal. The valley sense-and-hold circuit 253 is coupled to the current sense circuit 130, for sensing and holding the valley valley according to the current sense signal CS, and generating a valley sense-and-hold signal. The offset circuit 255 is coupled to the valley sense-and-hold circuit 253, for offsetting the valley sense-and-hold signal with the second predetermined value, and generating a valley offset signal. The amplifier circuit A1 is coupled to the peak sense-and-hold circuit 251 and the offset circuit 255, for comparing the peak sense-and-hold signal with the valley offset signal, to generate the control signal Vgate, for regulating the peak-to-valley difference dpv to a non-negative and fixed second predetermined value.

Figure 4:
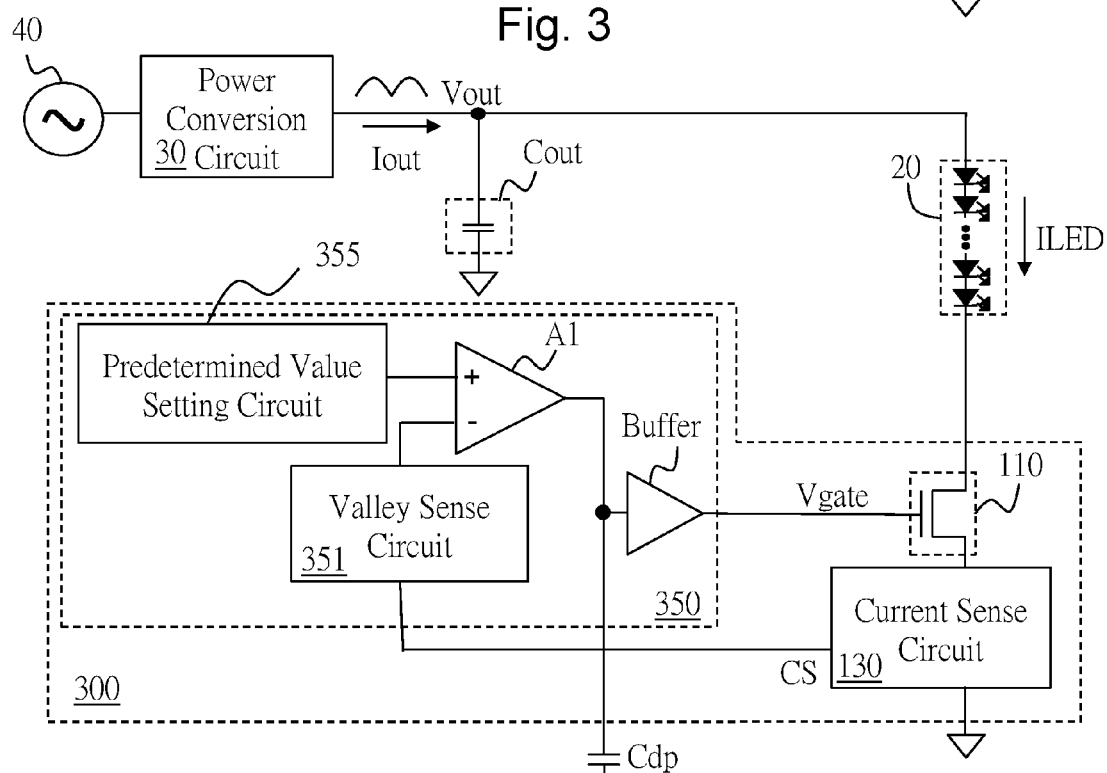
FIG. 4 shows a third embodiment of the present invention.

FIG. 4 show a third embodiment of the present invention. This embodiment shows another embodiment of the current regulator circuit capable of reducing current ripple according to the present invention. As shown in FIG. 4, in this embodiment, the current regulator circuit 300 capable of reducing current ripple includes: the regulator switch 110, the current sense circuit 130, and a control circuit 350. This embodiment is different from the first embodiment in that, in this embodiment, the control circuit 350 includes: a valley sense circuit 351, a predetermined value setting circuit 355, the amplifier circuit A1, and a buffer. The valley sense circuit 351 is coupled to the current sense circuit 130, for sensing the peak-to-valley difference dpv according to the current sense signal CS, and generating a peak-to-valley difference sense signal. The predetermined value setting circuit 355 is for generating an offset signal according to the second predetermined value. The amplifier circuit A1 and the buffer is coupled to the valley sense circuit 351 and the predetermined value setting circuit 355, for generating the control signal Vgate according to the peak-to-valley difference sense signal and the offset signal, to regulate the peak-to-valley difference dpv to the non-negative and fixed second predetermined value.

Figure 5:
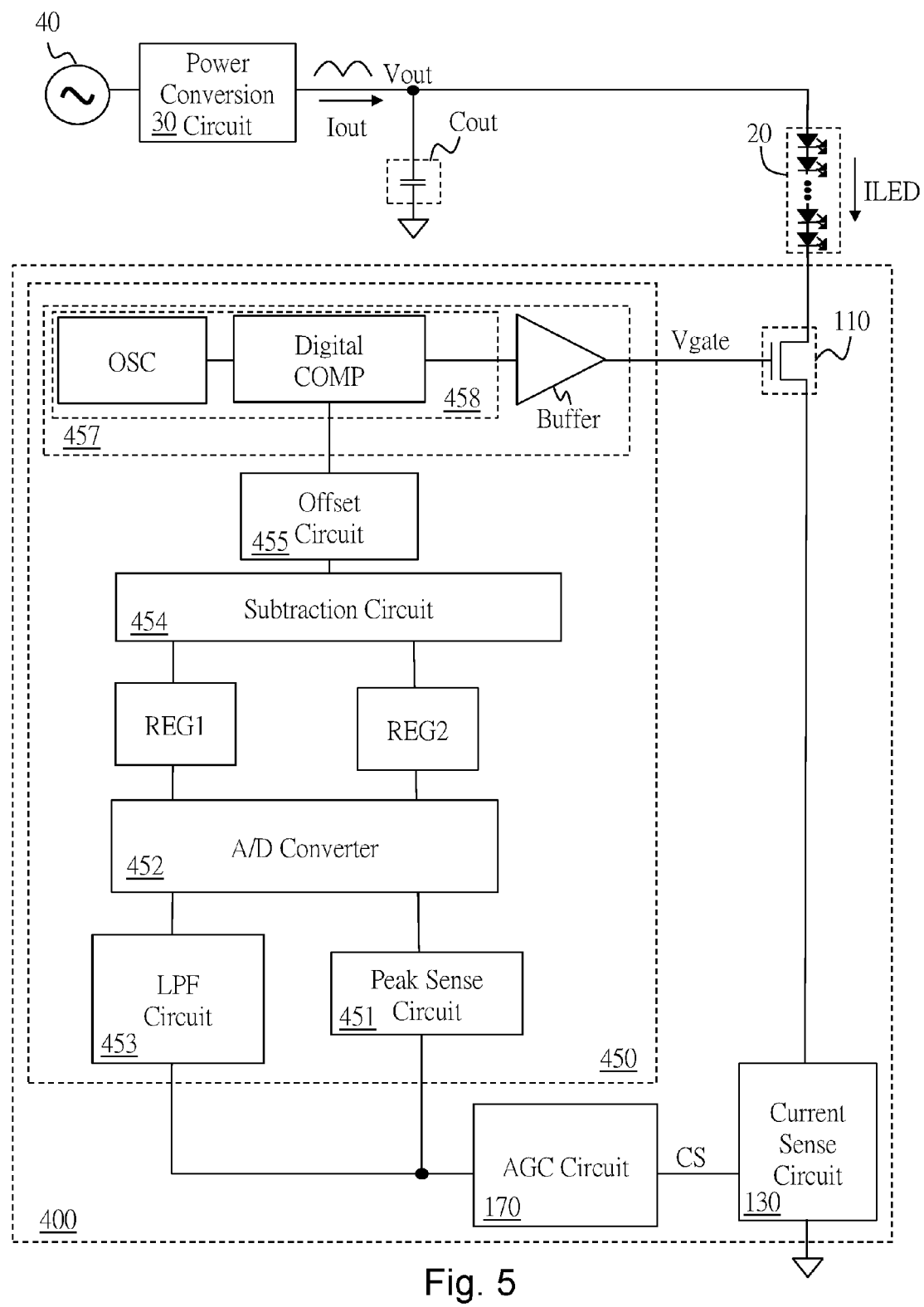
FIG. 5 shows a fourth embodiment of the present invention.

FIG. 5 show a fourth embodiment of the present invention. As shown in FIG. 5, in this embodiment, the current regulator circuit 400 capable of reducing current ripple includes: the regulator switch 110, the current sense circuit 130, a control circuit 450, and an automatic gain control (AGC) circuit 170. Compared with the aforementioned embodiments, this embodiment further includes an AGC circuit 170, which is coupled between the current sense circuit 130 and the control circuit 450, for adjusting the current sense signal CS within a predetermined range. As such, signals which are received by the control circuit 450 may be limited within the predetermined range, and therefore the internal devices of the control circuit 450 do not need to withstand a relatively higher voltage. If the predetermined range is a range in which digital signals can operate, the control circuit 450 may include digital circuit devices.

In this embodiment, the control circuit 450 includes: a peak sense circuit 451, a low-pass filter circuit 453, an analog-to-digital conversion circuit 452, registers REG1 and REG2, a subtraction circuit 454, an offset circuit 455, and a buffer circuit 457. The peak sense circuit 451 is coupled to the current sense circuit 130, for sensing the peak peak according to the current sense signal CS, and generating a peak sense signal. The low-pass filter circuit 453 is coupled to the current sense circuit 130 for obtaining the average avg of the current sense signal CS, and generating an average signal. In this embodiment, the peak sense circuit 451 and the low-pass filter circuit 453 are coupled to the current sense circuit 130 through the AGC circuit 170, to limit the amplitude of the current sense signal CS within the predetermined range.

In this embodiment, the analog-to-digital conversion circuit 452 is coupled to the peak sense circuit 451 and the low-pass filter circuit 453, for converting the peak sense signal and the average signal to a digital peak sense signal and a digital average signal respectively. The digital peak sense signal and the digital average signal are stored in the registers REG1 and REG2 respectively, and obtained by the subtraction circuit 454 as required. The subtraction circuit 454 is coupled to the analog-to-digital conversion circuit 452, for generating a digital peak-to-average difference signal according to the digital peak sense signal and the digital average signal. The offset circuit 455 is coupled to the subtraction circuit 454, for offsetting the digital peak-to-average difference signal with the first predetermined value, and generating a digital peak-to-average difference offset signal. The buffer circuit 457 is coupled to the offset circuit 455, for generating the control signal Vgate according to the digital peak-to-average difference offset signal, to regulate the peak-to-average difference dpa to the non-negative and fixed first predetermined value by feedback control.

In this embodiment, the buffer circuit 457 includes for example but not limited to an oscillator circuit 458 and a buffer. The oscillator circuit 458 includes an oscillator OSC and a digital compensator COMP, and is coupled to the offset circuit 455, for generating a digital control signal according to the digital peak-to-average difference offset signal and an oscillator frequency signal generated by the oscillator OSC. The buffer is coupled to the oscillator circuit 458, for receiving the digital control signal and generating the control signal Vgate with a proper analog level.

Figure 6:
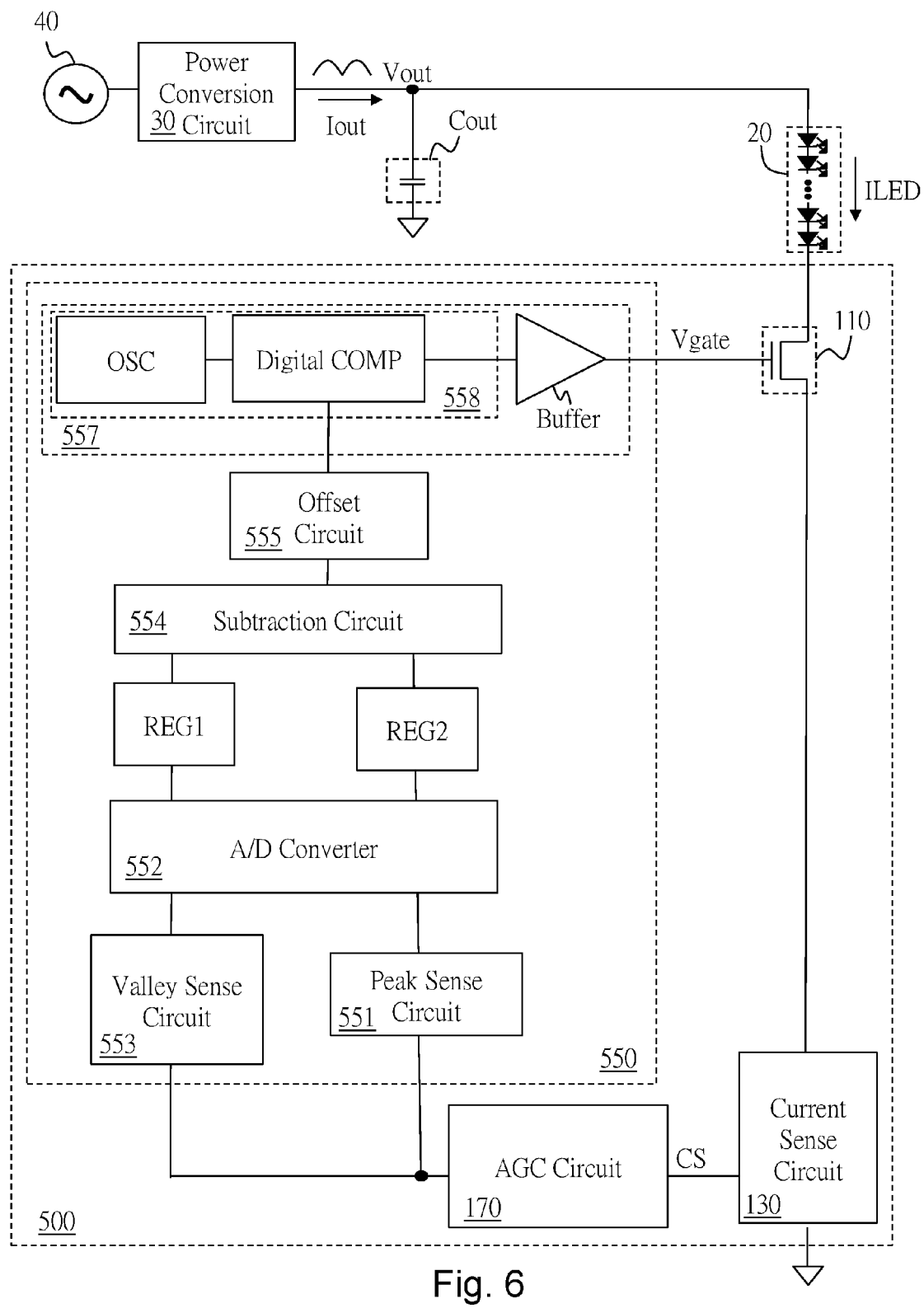
FIG. 6 shows a fifth embodiment of the present invention.

FIG. 6 shows a fifth embodiment of the present invention. This embodiment shows another embodiment of the current regulator circuit capable of reducing current ripple according to the present invention. As shown in FIG. 6, in this embodiment, the current regulator circuit 500 capable of reducing current ripple includes: the regulator switch 110, the current sense circuit 130, a control circuit 550, and the AGC circuit 170. In this embodiment, the control circuit 550 includes: a peak sense circuit 551, a valley sense circuit 553, an analog-to-digital conversion circuit 552, registers REG1 and REG2, a subtraction circuit 554, an offset circuit 555, and a buffer circuit 557. The peak sense circuit 551 is coupled to the current sense circuit 130, for sensing the peak peak according to the current sense signal CS, and generating a peak sense signal. The valley sense circuit 553 is coupled to the current sense circuit 130, for sensing the valley valley according to the current sense signal CS, and generating a valley sense signal. In this embodiment, the peak sense circuit 551 and the valley sense circuit 553 are coupled to the current sense circuit 130 through the AGC circuit 170, to limit the amplitude of the current sense signal CS within the predetermined range.

In this embodiment, the analog-to-digital conversion circuit 552 is coupled to the peak sense circuit 551 and the valley sense circuit 553, for converting the peak sense signal and the valley sense signal to a digital peak sense signal and a digital valley sense signal respectively. The digital peak sense signal and the digital valley sense signal are stored in the registers REG1 and REG2 respectively, and obtained by the subtraction circuit 554 as required. The subtraction circuit 554 is coupled to the analog-to-digital conversion circuit 552, for generating a digital peak-to-valley difference signal according to the digital peak sense signal and the digital valley sense signal. The offset circuit 555 is coupled to the subtraction circuit 554, for offsetting the digital peak-to-valley difference signal with the second predetermined value, and generating a digital peak-to-valley difference offset signal. The buffer circuit 557 is coupled to the offset circuit 555, for generating the control signal Vgate according to the digital peak-to-valley difference offset signal, to regulate the peak-to-valley difference dpv to the non-negative and fixed second predetermined value by feedback control.

In this embodiment, the buffer circuit 557 includes for example but not limited to an oscillator circuit 558 and a buffer. The oscillator circuit 558 includes the oscillator OSC and the digital compensator COMP, and is coupled to the offset circuit 555, for generating a digital control signal according to the digital peak-to-valley difference offset signal and an oscillator frequency signal generated by the oscillator OSC. The buffer is coupled to the oscillator circuit 558, for receiving the digital control signal and generating the control signal Vgate with a proper analog level.

In one embodiment, the current sense circuit 130 and the regulator switch 110 may be located external to an integrated circuit which includes the control circuit 550, for regulating the LED current ILED from outside of the integrated circuit. In another embodiment, the current sense circuit 130 and the regulator switch 110 may be integrated in the integrated circuit, together with the control circuit 550.

Figure 7:
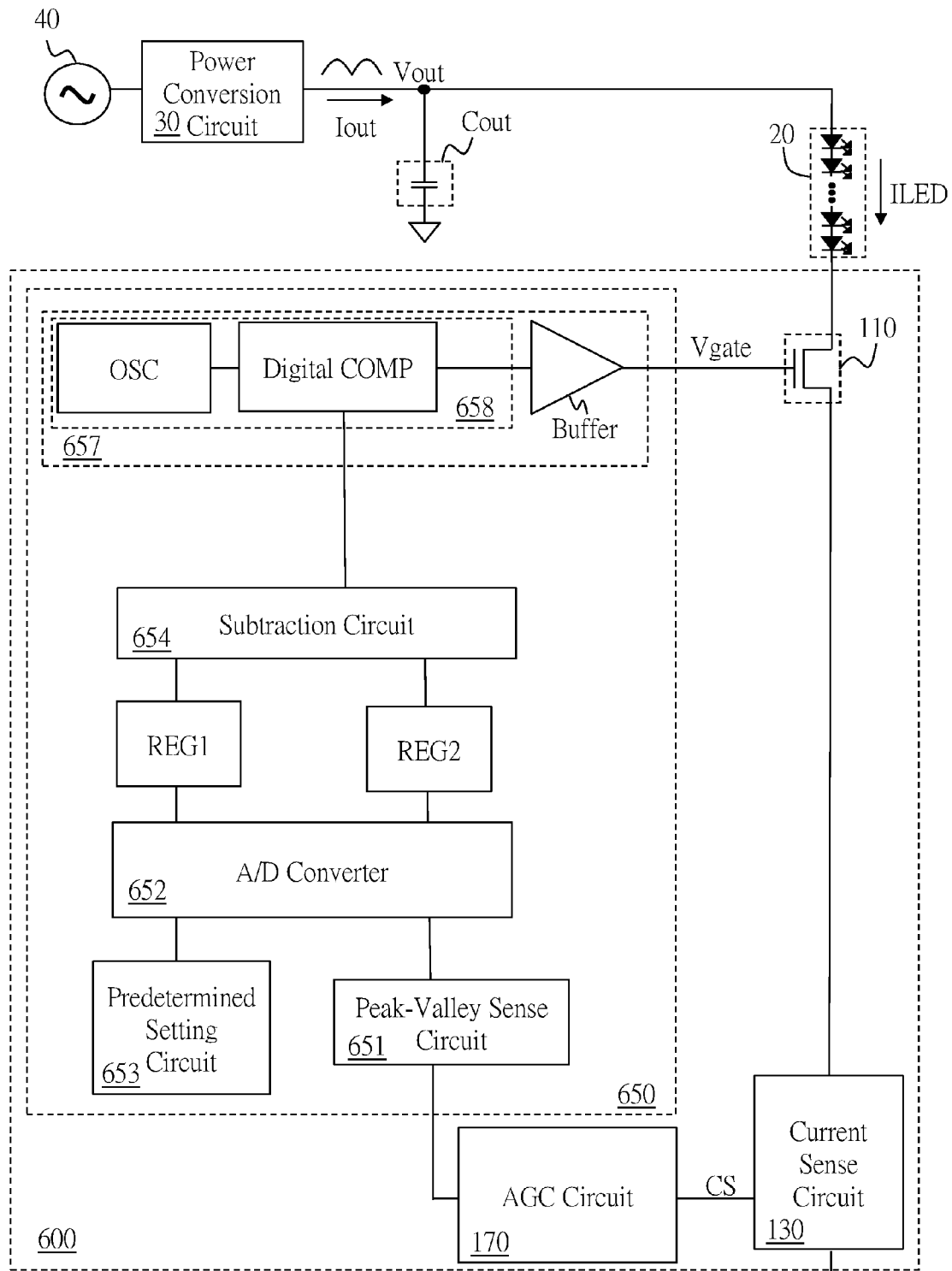
FIG. 7 shows a sixth embodiment of the present invention.

FIG. 7 shows a sixth embodiment of the present invention. This embodiment shows another embodiment of the current regulator circuit capable of reducing current ripple according to the present invention. As shown in FIG. 7, in this embodiment, the current regulator circuit 600 capable of reducing current ripple includes: the regulator switch 110, the current sense circuit 130, a control circuit 650, and the AGC circuit 170. In this embodiment, the control circuit 650 includes: a peak-to-valley difference sense circuit 651, a predetermined value setting circuit 653, an analog-to-digital conversion circuit 652, registers REG1 and REG2, a subtraction circuit 654, and a buffer circuit 657. The peak-to-valley difference sense circuit 651 is coupled to the current sense circuit 130, for sensing the peak-to-valley difference dpv according to the current sense signal CS, and generating a peak-to-valley difference sense signal. The predetermined value setting circuit 653 is for generating an offset signal according to the second predetermined value. In this embodiment, the peak-to-valley difference sense circuit 651 is coupled to the current sense circuit 130 through the AGC circuit 170, to limit the amplitude of the current sense signal CS within the predetermined range. The predetermined value setting circuit 653 is for converting the peak-to-valley difference sense signal and the offset signal to a digital peak-to-valley difference sense signal and a digital offset signal respectively. The subtraction circuit 654 is coupled to the analog-to-digital conversion circuit 652, for generating a digital peak-to-valley difference signal according to the digital peak-to-valley difference sense signal and the digital offset signal. The buffer circuit 657 is coupled to the subtraction circuit 654, for generating the control signal Vgate according to the digital peak-to-valley difference offset signal, to regulate the peak-to-valley difference dpv to the non-negative and fixed second predetermined value.

In this embodiment, the buffer circuit 657 includes for example but not limited to an oscillator circuit 658 and a buffer. The oscillator circuit 658 includes the oscillator OSC and the digital compensator COMP, for generating a digital control signal according to the digital peak-to-valley difference offset signal and an oscillator frequency signal generated by the oscillator OSC. The buffer is coupled to the oscillator circuit 658, for receiving the digital control signal and generating the control signal Vgate with a proper analog level.

In the aforementioned fourth, fifth, and sixth embodiments with digital operations, the frequency of the oscillator frequency signal generated by the oscillator OSC is preferably adjustable, such that a proper frequency may be decided according to the feedback response, to more efficiently regulate the LED current ILED.

Figure 8:
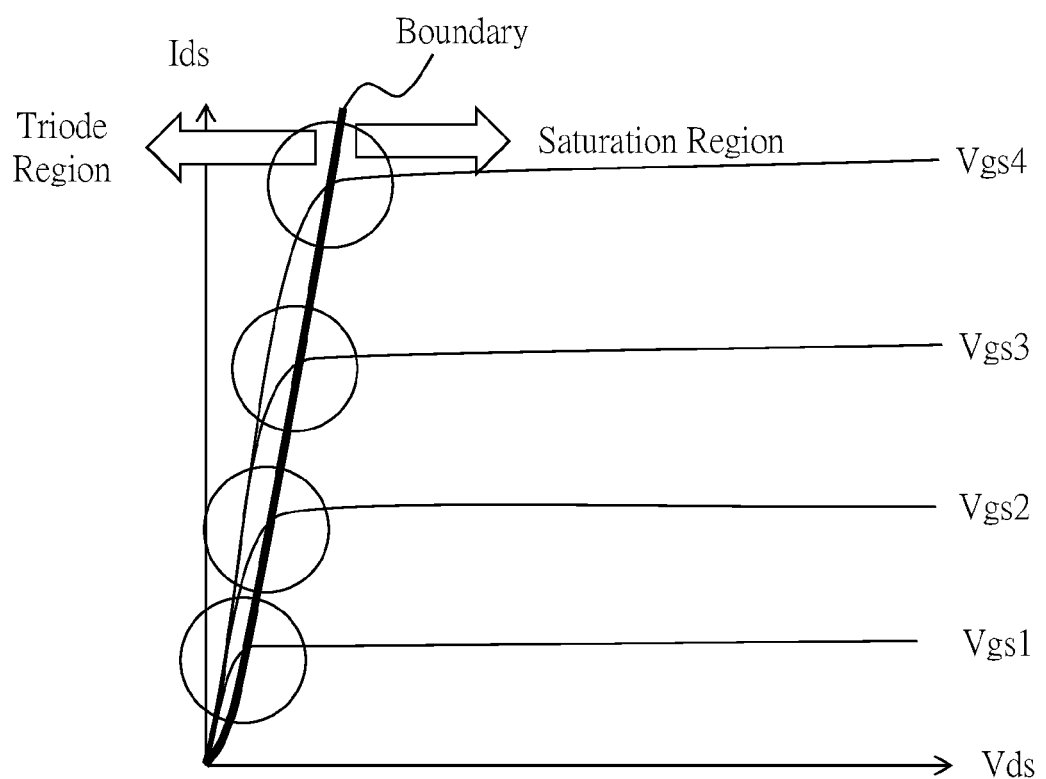
FIG. 8 shows an example of a schematic diagram of the characteristics of an NMOS device in a regulator switch 110.

Note that, in all the aforementioned embodiments, preferably, the regulator switch 110 is controlled to operate around a boundary of a triode region and a saturation region. More specifically, when the regulator switch 110 is a metal oxide semiconductor (MOS) device, such as an N-type MOS (NMOS) device, wherein the drain of the NMOS device is connected to a reverse terminal of the LED circuit 20, the source of the NMOS device is connected to the current sense circuit 130, and the gate of the NMOS device receiving the control signal Vgate, FIG. 8 shows an example of a schematic diagram of the characteristics of an NMOS device in the regulator switch 110. The lateral axis indicates the drain-source voltage Vds, and the vertical axis indicates a drain-source current Ids. In the aforementioned embodiments, the drain-source current Ids is the LED current ILED. Characteristic curves corresponding to different gate-source voltages Vgs1-Vgs4 are shown in FIG. 8. As shown in the figure, a preferable operation region of the regulator switch 110 is around the boundary of the triode region and the saturation region, as shown by the circles. "Around", means about +/−20% of the drain-source voltage Vds at the boundary. Depending on the characteristics of each regulator switch 110, the regulator switch 110 is preferably controlled to operate around the boundary of the triode region and the saturation region corresponding to the device, such that the amplitude of the current ripple of the drain-source current Ids is controlled to be a non-zero predetermined value, but not necessarily totally cancelled. As such, the primary goal is achieved, i.e., the flicker of the LED circuit 20 is reduced and less perceivable, and furthermore, the voltage drop of the regulator switch 110 (corresponding to the drain-source voltage Vds) is controlled in a relatively lower range, and the signals processed by the control circuit are also in a relatively lower range such that the devices inside the control circuit do not need to withstand relatively higher voltages. Thus, the power consumption is reduced to improve the power utilization efficiency, and the manufacturing cost is reduced.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a device or circuit which does not substantially influence the primary function of a signal can be inserted between any two devices or circuits shown to be in direct connection in the embodiments, so the term "couple" should include direct and indirect connections. For another example, the light emitting device that is applicable to the present invention is not limited to the LED as shown and described in the embodiments above, but may be any light emitting device with a forward terminal and a reverse terminal. For another example, an NMOS device shown in the embodiments may be replaced by a PMOS device, with corresponding amendments to the circuit and the signals. For another example, a part of one embodiment can be adopted by another embodiment; for example, the AGC circuit 17 shown in FIG. 5 can be adopted in the embodiments shown in FIGS. 2-4. For another example, when an external signal of the control circuit (for example but not limited to the current sense signal) is received by the control circuit, and is processed inside the control circuit, a voltage-to-current conversion, a current-to-voltage conversion, and/or a ratio conversion, etc. may be performed during receiving or processing this signal, and therefore, to perform an action according to a certain signal is not limited to performing an action strictly according to the signal itself, but can be performing an action according to a converted form or a scaled-up or down form of the signal. In view of the foregoing, the spirit of the present invention should cover all such and other modifications and variations, which should be interpreted to fall within the scope of the following claims and their equivalents.

What is claimed is:

1. A current regulator circuit, which is configured to operably regulate a load current flowing through a load circuit coupled to the current regulator circuit, wherein the load circuit is coupled to a power supply circuit which provides an output voltage and a load current to the load circuit, wherein the current regulator circuit is configured to operably reduce a current ripple in the load current, the current regulator circuit comprising:
    a regulator switch, which is configured to be operably coupled to the load circuit, and operate according to a control signal, to regulate the load current;
    a current sense circuit, which is coupled to the regulator switch, and configured to operably sense the load current to generate a current sense signal; and
    a control circuit, which is coupled to the regulator switch and the current sense circuit, and configured to operably generate a control signal for controlling the regulator switch according to the current sense signal, wherein the control circuit regulates a peak-to-average difference to a non-negative and fixed first predetermined value, wherein the peak-to-average difference is obtained according to a peak of the current sense signal minus an average of the current sense signal, or regulates a peak-to-valley difference to a non-negative and fixed second predetermined value, wherein the peak-to-valley difference is obtained according to the peak of the current sense signal minus a valley of the current sense signal.

2. The current regulator circuit of claim 1, wherein the regulator switch is controlled to operate around a boundary of a triode region and a saturation region.

3. The current regulator circuit of claim 1, further comprising an auto-gain control circuit, which is coupled between the current sense circuit and the control circuit, and configured to operably adjust the current sense signal within a predetermined range.

4. The current regulator circuit of claim 1, wherein the control circuit includes:
    a peak sense-and-hold circuit, which is coupled to the current sense circuit, and configured to operably sense and hold the peak of the current sense signal, so as to generate a peak sense-and-hold signal;
    a low-pass filter circuit, which is coupled to the current sense circuit, and configured to operably obtain the average of the current sense signal, so as to generate an average signal;
    an offset circuit, which is coupled to the low-pass filter circuit, and configured to operably offset the average with the first predetermined value, so as to generate an average offset signal; and
    an amplifier circuit, which is coupled to the peak sense-and-hold circuit and the offset circuit, and configured to operably compare the peak sense-and-hold signal with the average offset signal, to generate the control signal, for regulating the peak-to-average difference to the first predetermined value.

5. The current regulator circuit of claim 1, wherein the control circuit includes:
    a peak sense-and-hold circuit, which is coupled to the current sense circuit, and configured to operably sense and hold the peak of the current sense signal, so as to generate a peak sense-and-hold signal;
    a valley sense-and-hold circuit, which is coupled to the current sense circuit, and configured to operably sense and hold the valley of the current sense signal, so as to generate a valley sense-and-hold signal;
    an offset circuit, which is coupled to the valley sense-and-hold circuit, and configured to operably offset the valley sense-and-hold signal with the second predetermined value, so as to generate a valley offset signal; and
    an amplifier circuit, which is coupled to the peak sense-and-hold circuit and the offset circuit, and configured to operably compare the peak sense-and-hold signal with the valley offset signal, to generate the control signal, for regulating the peak-to-valley difference to the second predetermined value.

6. The current regulator circuit of claim 1, wherein the control circuit includes:
    a peak and valley sense circuit, which is coupled to the current sense circuit, and configured to operably sense the peak-to-valley difference according to the current sense signal, so as to generate a peak-to-valley difference sense signal;
    a predetermined value setting circuit, which is configured to operably generate an offset signal according to the second predetermined value; and
    an amplifier circuit, which is coupled to the peak and valley sense circuit and the predetermined value setting circuit, and configured to operably generate the control signal according to the peak-to-valley difference sense signal and the offset signal, for regulating the peak-to-valley difference to the second predetermined value.

7. The current regulator circuit of claim 1, wherein the control circuit includes:
    a peak sense circuit, which is coupled to the current sense circuit, and configured to operably sense the peak of the current sense signal, so as to generate a peak sense signal;

a low-pass filter circuit, which is coupled to the current sense circuit, and configured to operably obtain the average of the current sense signal, so as to generate an average signal;

an analog-to-digital conversion circuit, which is coupled to the peak sense circuit and the low-pass filter circuit, and configured to operably convert the peak sense signal and the average signal to a digital peak sense signal and a digital average signal respectively;

a subtraction circuit, which is coupled to the analog-to-digital conversion circuit, and configured to operably generate a digital peak-to-average difference signal according to the digital peak sense signal and the digital average signal;

an offset circuit, which is coupled to the subtraction circuit, and configured to operably offset the digital peak-to-average difference signal with the first predetermined value, so as to generate a digital peak-to-average difference offset signal; and a buffer circuit, which is coupled to the offset circuit, and configured to operably generate the control signal according to the digital peak-to-average difference offset signal, for regulating the peak-to-average difference to the first predetermined value.

8. The current regulator circuit of claim 7, wherein the buffer circuit includes:

an oscillator circuit, which is coupled to the offset circuit, and configured to operably generate a digital control signal according to the digital peak-to-average difference offset signal and an oscillator frequency signal; and a buffer, which is coupled to the oscillator circuit, and configured to operably receive the digital control signal and generate the control signal.

9. The current regulator circuit of claim 1, wherein the control circuit includes:

a peak sense circuit, which is coupled to the current sense circuit, and configured to operably sense the peak of the current sense signal, so as to generate a peak sense signal;

a valley sense circuit, which is coupled to the current sense circuit, and configured to operably sense the valley of the current sense signal, so as to generate a valley sense signal;

an analog-to-digital conversion circuit, which is coupled to the peak sense circuit and the valley sense circuit, and configured to operably convert the peak sense signal and the valley sense signal to a digital peak sense signal and a digital valley sense signal respectively;

a subtraction circuit, which is coupled to the analog-to-digital conversion circuit, and configured to operably generate a digital peak-to-valley difference signal according to the digital peak sense signal and the digital valley sense signal;

an offset circuit, which is coupled to the subtraction circuit, and configured to operably offset the digital peak-to-valley difference signal with the second predetermined value, so as to generate a digital peak-to-valley difference offset signal; and a buffer circuit, which is coupled to the offset circuit, and configured to operably generate the control signal according to the digital peak-to-valley difference offset signal, for regulating the peak-to-valley difference to the second predetermined value.

10. The current regulator circuit of claim 9, wherein the buffer circuit includes:

an oscillator circuit, which is coupled to the offset circuit, and configured to operably generate a digital control signal according to the digital peak-to-average difference offset signal and an oscillator frequency signal; and a buffer, which is coupled to the oscillator circuit, and configured to operably receive the digital control signal and generate the control signal.

11. The current regulator circuit of claim 1, wherein the control circuit includes:

a peak and valley sense circuit, which is coupled to the current sense circuit, and configured to operably sense the peak-to-valley difference according to the current sense signal, so as to generate a peak-to-valley difference sense signal;

a predetermined value setting circuit, which is configured to operably generate an offset signal according to the second predetermined value;

an analog-to-digital conversion circuit, which is coupled to the peak and valley sense circuit and the predetermined value setting circuit, and configured to operably convert the peak-to-valley difference sense signal and the offset signal to a digital peak-to-valley difference sense signal and a digital offset signal respectively;

a subtraction circuit, which is coupled to the analog-to-digital conversion circuit, and configured to operably generate a digital peak-to-valley difference signal according to the digital peak-to-valley difference sense signal and the digital offset signal; and a buffer circuit, which is coupled to the subtraction circuit, and configured to operably generate the control signal according to the digital peak-to-valley difference offset signal, for regulating the peak-to-valley difference to the second predetermined value.

12. The current regulator circuit of claim 11, wherein the buffer circuit includes:

an oscillator circuit, which is coupled to the subtraction circuit, and configured to operably generate a digital control signal according to the digital peak-to-valley difference offset signal and an oscillator frequency signal; and a buffer, which is coupled to the oscillator circuit, and configured to operably receive the digital control signal and generate the control signal.

13. A method of reducing current ripple, wherein a power supply circuit provides an output voltage and a load current to a load circuit, and the method of reducing current ripple is for reducing a current ripple in the load current, the method comprising:

sensing the load current flowing through the load circuit to generate a current sense signal;

generating a control signal according to the current sense signal;

operating a regulator switch according to the control signal, to regulate the load current; and feedback controlling a peak-to-average difference to a non-negative and fixed first predetermined value, wherein the peak-to-average difference is obtained according to a peak of the current sense signal minus an average of the current sense signal, or feedback controlling a peak-to-valley difference to a non-negative and fixed second predetermined value, wherein the peak-to-valley difference is obtained according to the peak of the current sense signal minus a valley of the current sense signal.

14. The method of reducing current ripple of claim 13, wherein the regulator switch is controlled to operate around a boundary of a triode region and a saturation region.

15. The method of reducing current ripple of claim 13, further comprising: adjusting the current sense signal within a predetermined range.

16. The method of reducing current ripple of claim 13, wherein the step of generating a control signal according to the current sense signal includes:
   sensing and holding the peak of the current sense signal, to generate a peak sense-and-hold signal;
   obtaining the average of the current sense signal, to generate an average signal;
   offsetting the average signal with the first predetermined value, to generate an average offset signal; and
   comparing the peak sense-and-hold signal with the average offset signal, to generate the control signal, for controlling the peak-to-average difference to the first predetermined value.

17. The method of reducing current ripple of claim 13, wherein the step of generating a control signal according to the current sense signal includes:
   sensing and holding the peak of the current sense signal, to generate a peak sense-and-hold signal;
   sensing and holding the valley of the current sense signal, to generate a valley sense-and-hold signal;
   offsetting the valley sense-and-hold signal with the second predetermined value, to generate a valley offset signal; and
   comparing the peak sense-and-hold signal with the valley offset signal, to generate the control signal, for controlling the peak-to-valley difference to the second predetermined value.

18. The method of reducing current ripple of claim 13, wherein the step of generating a control signal according to the current sense signal includes:
   sensing the peak-to-valley difference of the current sense signal, to generate a peak-to-valley difference sense signal;
   generating an offset signal according to the second predetermined value; and
   generating the control signal according to the peak-to-valley difference sense signal and the offset signal, for controlling the peak-to-valley difference to the second predetermined value.

19. The method of reducing current ripple of claim 13, wherein the step of generating a control signal according to the current sense signal includes:
   sensing the peak of the current sense signal, to generate a peak sense signal;
   obtaining the average of the current sense signal, to generate an average signal;
   converting the peak sense signal and the average signal to a digital peak sense signal and a digital average signal respectively;
   generating a digital peak-to-average difference signal according to the digital peak sense signal and the digital average signal;
   offsetting the digital peak-to-average difference signal with the first predetermined value, to generate a digital peak-to-average difference offset signal; and
   generating the control signal according to the digital peak-to-average difference offset signal, for controlling the peak-to-average difference to the first predetermined value.

20. The method of reducing current ripple of claim 19, wherein the step of generating the control signal according to the digital peak-to-average difference offset signal includes:
   generating a digital control signal according to the digital peak-to-average difference offset signal and an oscillator frequency signal; and
   converting the digital control signal to the control signal.

21. The method of reducing current ripple of claim 13, wherein the step of generating a control signal according to the current sense signal includes:
   sensing the peak of the current sense signal, to generate a peak sense signal;
   sensing the valley of the current sense signal, to generate a valley sense signal;
   converting the peak sense signal and the valley sense signal to a digital peak sense signal and a digital valley sense signal respectively;
   generating a digital peak-to-valley difference signal according to the digital peak sense signal and the digital valley sense signal;
   offsetting the digital peak-to-valley difference signal with the second predetermined value, to generate a digital peak-to-valley difference offset signal; and
   generating the control signal according to the digital peak-to-valley difference offset signal, for controlling the peak-to-valley difference to the second predetermined value.

22. The method of reducing current ripple of claim 21, wherein the step of generating the control signal according to the digital peak-to-valley difference offset signal includes:
   generating a digital control circuit according to the digital peak-to-valley difference offset signal and an oscillator frequency signal; and
   converting the digital control signal to the control signal.

23. The method of reducing current ripple of claim 13, wherein the step of generating a control signal according to the current sense signal includes:
   sensing the peak-to-valley difference of the current sense signal, to generate a peak-to-valley difference sense signal;
   generating an offset signal according to the second predetermined value;
   converting the peak-to-valley difference sense signal and the offset signal to a digital peak-to-valley difference sense signal and a digital offset signal respectively;
   generating a digital peak-to-valley difference signal according to the digital peak-to-valley difference sense signal and the digital offset signal; and
   generating the control signal according to the digital peak-to-valley difference offset signal, for controlling the peak-to-valley difference to the second predetermined value.

24. The method of reducing current ripple of claim 23, wherein the step of generating the control signal according to the digital peak-to-valley difference offset signal includes:
   generating a digital control circuit according to the digital peak-to-valley difference offset signal and an oscillator frequency signal; and
   converting the digital control signal to the control signal.

* * * * *